(12) United States Patent
Hsu

(10) Patent No.: US 6,886,146 B2
(45) Date of Patent: Apr. 26, 2005

(54) METHOD OF BYPASSING A PLURALITY OF CLOCK TREES IN EDA TOOLS

(75) Inventor: Kuo-Han Hsu, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 149 days.

(21) Appl. No.: 10/248,751

(22) Filed: Feb. 14, 2003

(65) Prior Publication Data

US 2004/0163065 A1 Aug. 19, 2004

(51) Int. Cl.$^7$ .............................................. G06F 17/50
(52) U.S. Cl. ................................. 716/6; 716/16; 716/17
(58) Field of Search ............................... 716/6, 16, 17, 716/1, 2, 10, 13; 710/305; 703/14

(56) References Cited

U.S. PATENT DOCUMENTS 5,410,491 A * 4/1995 Minami ........................ 716/6
6,640,277 B1 * 10/2003 Moertl ....................... 710/305

* cited by examiner

Primary Examiner—Thuan Do
(74) Attorney, Agent, or Firm—Winston Hsu

(57) ABSTRACT

A method for using timing simulation and authentication software of an EDA tool (electronics design automatic tool) to bypass a plurality of clock trees in the EDA tool. The EDA tool contains a plurality of clocking devices that prevent the timing simulation and authentication software from changing an order of the plurality of clocking devices. The method includes measuring a delay time of the clocking device, and providing a first buffer, which is electrically connected to the clocking device, according to the delay time, wherein the delay time of the first buffer approximates the delay time of the clocking device.

5 Claims, 3 Drawing Sheets

METHOD OF BYPASSING A PLURALITY OF CLOCK TREES IN EDA TOOLS

BACKGROUND OF INVENTION

1. Field of the Invention

The present invention relates to a method for bypassing a plurality of clock trees in an EDA tool (electronics design automatic tool), and more particularly, to a method for using timing simulation and authentication software of an EDA tool to bypass a plurality of clock trees in the EDA tool.

2. Description of the Prior Art

In the current chip-design industry, due to the abundance of CAD tools, EDA tools for designing various electronic ICs have matured. For each process of IC design, there are specific and appropriate EDA tools provided for the chip developers.

Please refer to the FIG. 1. FIG. 1 is a flowchart of the digital circuit design process of the prior art. Generally, the process of the digital circuit design can be divided into the establishment of specification and structures, the design and identification of the RTL (register-transfer level), the design and certification of the Gate-Level, and the design and simulation of the electric circuit layout.

Regarding the process of the establishment of specification and structures, just as its name implies, the process sets some important specifications, functions, and parameters of the desired object before developing a digital circuit. The main purpose of the design and identification of RTL is to express the behaviors of the digital logic circuit. Regarding the concrete way of how to express, the currently popular method is to implement the steps that describe the logic behaviors of the digital circuit with a hardware description language (HDL) that is very similar to a general software programming language. After completing HDL programming, the HDL will be immediately compiled to a high-level logic electric circuit with a corresponding compiler. Because that the HDL can be easily modified, revised, and enlarged with more functions, its functions have become an industry standard. Take VHDL and Verilog, two of the most popular HDLs, for example. They have become industry standards after repeated corrections. Regarding the design and certification of the Gate-Level, the high-level logic electric circuit will be further converted to the low-level logic electric circuit. For example, a full adder will be converted to a plurality of XOR, OR, and AND Gates. Regarding the final process of the design and simulation of the electric circuit layout, an electric circuit layout auto-creation program will create an electric circuit layout diagram. For example, the program "Cadence Ensemble" can convert the low-level logic electric circuit of the Gate-Level to the electric circuit layout diagram. The electric circuit layout diagram will be sent to a wafer factory for carrying out chip production after passing through some testing and confirmation procedures.

For ensuring the quality of the manufactured chips, careful simulations and tests are necessary in each process. Therefore, the process of the RTL, the Gate-Level, and the design and simulation of the electric circuit layout respectively have their own specific simulation and identification programs. In addition, the lower-level process is closer to the actual chip operating conditions, and the corresponding simulation and identification programs have to be more sophisticated and precise. For example, in the process of the RTL, the parameters can be roughly decided with the delay time of the high-level logic elements, and the parameters usually can be roughly programmed as ideal values under most of conditions. However, in the process of the Gate-Level or even in the process of the design and simulation of the electric circuit layout, the simulation and identification programs have to consider single logic gages, or even a parameter of a transistor and the delay time of a metal wire.

In order to ensure that the chip can operate well in the four limiting corners during the semiconductor manufacturing process, the chip developers have to make sure the "margin" is large enough for "timing", and the key lies in the synchronization of the clock signal. That is, the clock signal should be in phase. The system usually comprises a main transmission line, and the main clock signal is transmitted toward each independent area of the chip by a plurality of branch transmission lines connected with the main transmission line. Since part of the independent areas will operate with the main clock, such as raising or decreasing the frequency of the main clock, and the transmission line will cause the signal delays, the phase of each clock signal in each branch transmission line will be a little different. The non-synchronizing effect critically influences the digital circuits that require extremely precise timing. Therefore, the synchronization between the main clock signal and each branch clock signal is essential. The EDA tool of the present invention can make use of the results of the timing simulation and authentication to synchronize the devices that require synchronization. The EDA tool will slightly adjust those devices with a laggard clock or a transcended clock. For example, installing a buffer in the metal wire that transmits the clock signal will cause a little delay of the clock signal transmitted in the transmission line, or shortening the metal wire can shorten the transmission time of the clock signal. All the above-mentioned methods are based on the fact that the timing simulation and authentication software can precisely measure all the timing data.

However, most other current timing simulation and authentication software cannot bypass some devices that comprise the clocking device such as a flip-flop or a latch. The phenomenon of "non-bypass" will cause the result that the synchronization of the EDA tool will be limited only in the input port of the clocking device, and the synchronization of the clock signals in the other branch devices behind the clocking device cannot be achieved at the same time with the synchronization of the clocking device. The synchronization has to be performed in each branch device respectively. This effect is harmful to the large-scale digital circuits that comprise numerous clocking devices and branch devices.

Recently, although there are a few EDA tools that can bypass the clocking devices during the process of the timing simulation and authentication, chip developers have to pay extremely high prices obtain this function.

SUMMARY OF INVENTION

It is therefore a primary objective of the claimed invention to provide a method for using timing simulation and authentication software of an EDA tool to bypass a plurality of clock trees in the EDA tool in order to solve the above-mentioned problems of the prior art.

According to the claimed invention, a method for using timing simulation and authentication software of an EDA tool to bypass a plurality of clock trees in the EDA tool. The EDA tool comprises a plurality of clocking devices that prevent the timing simulation and authentication software from changing an order of the plurality of clocking devices. The method comprises measuring a delay time of the clocking device, and providing a first buffer, which is electrically connected to the clocking device, according to the delay time, wherein the delay time of the first buffer approximates the delay time of the clocking device.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
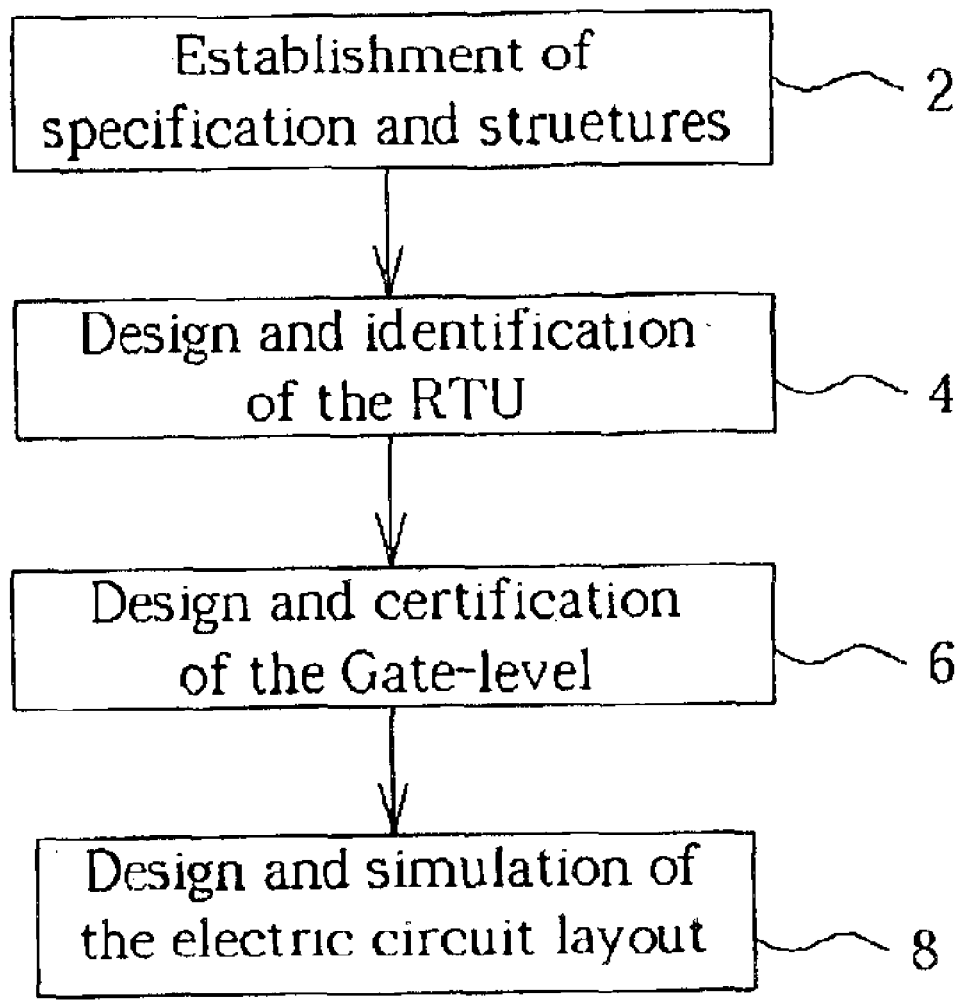
FIG. 1 is a flowchart of a digital circuit design process of the prior art.
Figure 2:
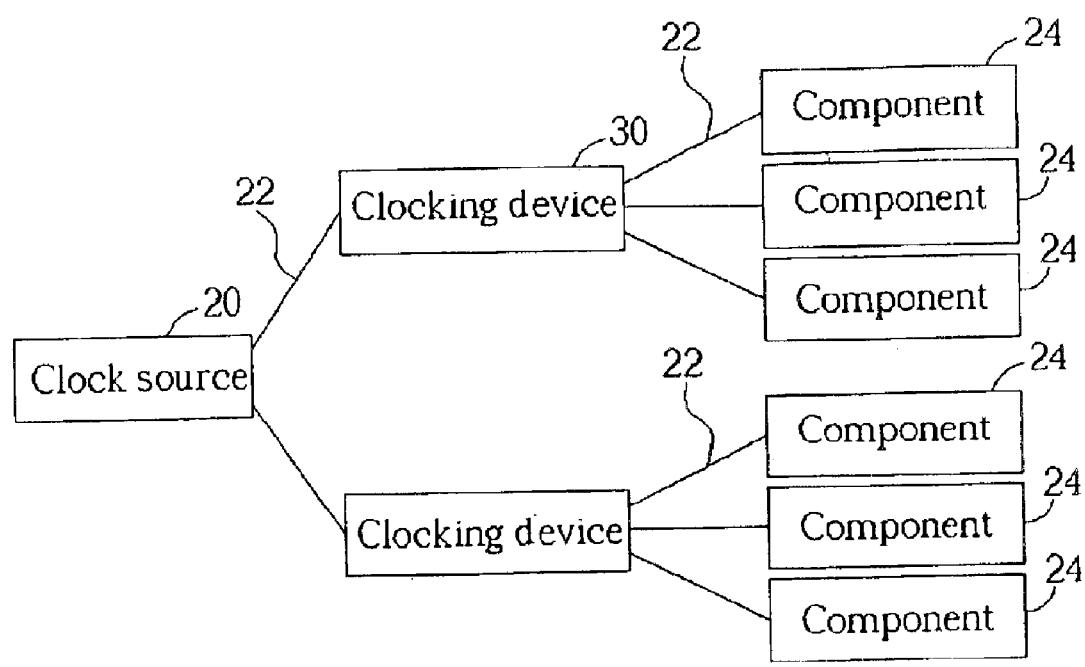
FIG. 2 is a schematic diagram of a digital clocking circuit of the present invention.

Please refer to the FIG. 2. FIG. 2 a schematic diagram of a digital clocking circuit 18 of the present invention. As the FIG. 2 shows, the digital clocking circuit 18 comprises a clock source 20, a plurality of clock trees 22, a plurality of components 24, and a plurality of clocking devices 30. The clocking device 30 cannot be bypassed by timing simulation and authentication software, that is, when the timing simulation and authentication software follows the clock trees 22, the timing simulation and authentication software will be blocked by the clocking device 30. The timing simulation and authentication software cannot directly trace the components 24 connected with the clock trees 22 behind the clocking device 30. Therefore, the timing simulation and authentication software cannot directly adjust the components 24 connected with the clock trees 22 behind the clocking device 30 when operating the functions of the synchronization (in-phase). In order that the timing simulation and authentication software can smoothly bypass the clocking device 30 to measure the timing information of the clock trees 22, the following methods can be adopted.

Figure 3:
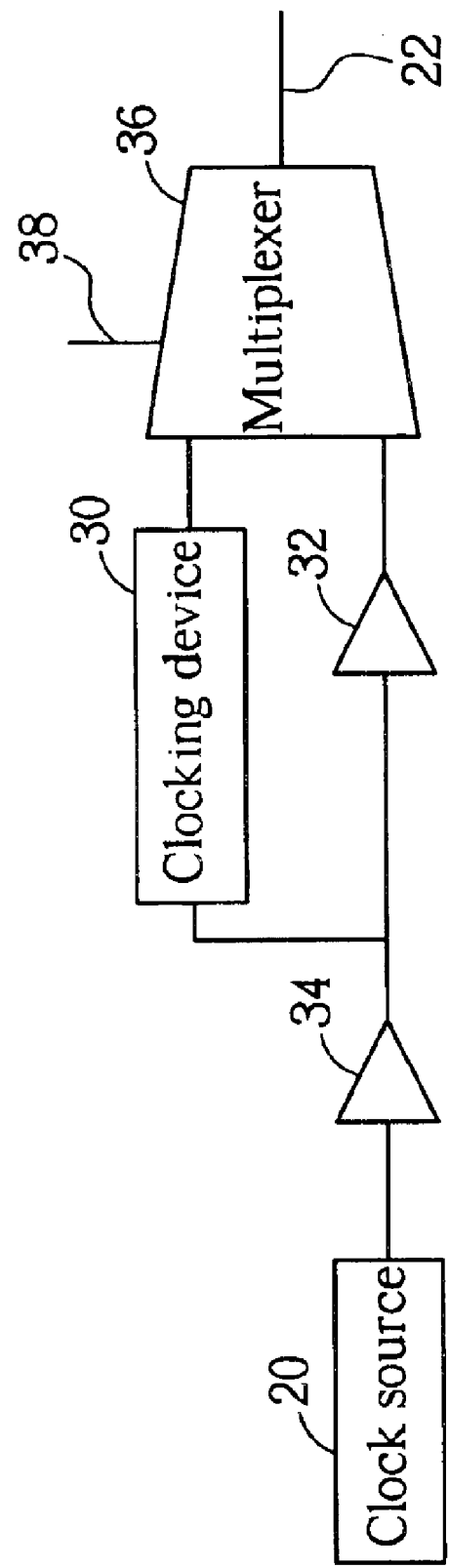
FIG. 3 is a schematic diagram of an electric circuit layout diagram of an embodiment of the present invention.

Please refer to the FIG. 3. FIG. 3 is a schematic diagram of an electric circuit layout diagram of an embodiment of the present invention. The embodiment comprises the clocking device 30, a multiplexer 36, and a first buffer 32. The delay time of the clocking device 30 is a predicted value t1. At beginning, the developer makes use of an EDA tool to generate the first buffer 32 with the delay time approximating the value t1 in the electric circuit layout diagram. As FIG. 3 shows, a clock input port of the clocking device 30 and a clock input port of the first buffer 32 are connected to the clock source 20; and the clock output port of the clocking device 30 and the clock output port of the first buffer 32 are connected to the multiplexer 36. A selection line 38 of the multiplexer 36 in the present embodiment is given a certain value to make the output of the multiplexer 36 equal to the output of the first buffer 32. The first buffer 32 can be bypassed by the timing simulation and authentication software so that the timing simulation and authentication software can move across the clocking device 30 to carry on tracing the timing information from the first buffer 32. After the timing simulation and authentication software completes the synchronization, the multiplexer 36 can select clock trees to pass the clocking device 30.

Furthermore, there is a second buffer 34 installed between the first buffer 32 and clocking source 20. Before a clock signal enters the clocking device 30, it has to pass through a transmissions line, and the transmission line will cause a delay of the clock signal. Although the delay time can be identified by the timing simulation and authentication software, the transmitting time by which the clock signal is transmitted to the clocking device 30 may be a little bit different from the transmitting time by which the clock signal is transmitted to the first buffer 32. The slight difference may cause the delay time to not be accurately estimated. For the sake of accuracy, the developer has to take the effect of the transmission line into consideration when deciding the delay time of the first buffer 32. Therefore, the present invention comprises the second buffer 34 approaching the clock inputs ports of the clocking device 30 and the first buffer 32 to ensure that the distance between the second buffer 34 and the first buffer 32 approximates the distance between the second buffer 34 and the clocking device 30 for significantly reducing the inaccuracy.

In contrast to the prior art, the method of the present invention can provide a buffer to make the timing simulation and authentication software to achieve the synchronization through the buffer. Therefore, the chip developer does not need to change the original EDA tool to increase the functionality of the EDA tool.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for using timing simulation and authentication software of an EDA tool (electronics design automatic tool) to bypass a plurality of clock trees in the EDA tool, the EDA tool comprising a plurality of clocking devices that prevent the timing simulation and authentication software from changing an order of the plurality of clocking devices, the method comprising:

measuring a delay time of the clocking device;

providing a first buffer, which is electrically connected to the clocking device, wherein the delay time of the first buffer approximates the delay time of the clocking device;

connecting a clock input port of the first buffer to a clock input port of the clocking device;

connecting a clock output port of the first buffer and a clock output port of the clocking device to a multiplexer; and controlling the multiplexer to output a clock signal transmitted from the first buffer when executing the timing simulation and authentication software.

2. The method of claim 1 further comprising connecting a second buffer to a clock input port of the first buffer and a clock input port of the clocking device in order to ensure a distance between the second buffer and the first buffer approximates a distance between the second buffer and the clocking device.

3. The method of claim 1 wherein the timing simulation and authentication software comprises a static timing analyzer (STA).

4. The method of claim 1 wherein the EDA tool further comprises an electric circuit layout auto-creation program, and the first buffer is generated by the electric circuit layout auto-creation program.

5. The method of claim 1 wherein the clocking device comprises a flip-flop.

* * * * *